US012772478B2

(12) United States Patent
Xu et al.

(10) Patent No.: US 12,772,478 B2
(45) Date of Patent: Oct. 20, 2026

(54) MANUFACTURING METHOD FOR LDMOS INTEGRATED DEVICE

(71) Applicant: CSMC TECHNOLOGIES FAB2 CO., LTD., Wuxi (CN)

(72) Inventors: Chaoqi Xu, Wuxi (CN); Shuxian Chen, Wuxi (CN); Chunxia Ma, Wuxi (CN); Yi Zhang, Wuxi (CN); Penglong Xu, Wuxi (CN); Feng Lin, Wuxi (CN); Ruibin Cao, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 372 days.

(21) Appl. No.: 18/292,067

(22) PCT Filed: Dec. 1, 2022

(86) PCT No.: PCT/CN2022/135755
§ 371 (c)(1),
(2) Date: Jan. 25, 2024

(87) PCT Pub. No.: WO2023/098775
PCT Pub. Date: Jun. 8, 2023

(65) Prior Publication Data
US 2024/0339522 A1 Oct. 10, 2024

(30) Foreign Application Priority Data
Dec. 3, 2021 (CN) ......................... 202111467541.1

(51) Int. Cl.
*H10D 30/01* (2025.01)
*H10D 30/60* (2025.01)
(Continued)

(52) U.S. Cl.
CPC ......... *H10D 30/0281* (2025.01); *H10D 30/65* (2025.01); *H10D 64/111* (2025.01)

(58) Field of Classification Search
CPC .. H10D 30/0281; H10D 30/65; H10D 84/835; H10D 30/0221; H10D 84/8311;
(Continued)

(56) References Cited

U.S. PATENT DOCUMENTS

2004/0251492 A1 12/2004 Lin
2008/0128831 A1* 6/2008 Chou .................. H10D 30/792 257/E21.633
(Continued)

FOREIGN PATENT DOCUMENTS

CN 102593170 A 7/2012
CN 107180873 A 9/2017
(Continued)

OTHER PUBLICATIONS

PCT International Search Report and Written Opinion (with English translations) for corresponding PCT Application No. PCT/CN2022/135755, mailed Feb. 24, 2024, 10 pages.
Office Action received in corresponding Application No. CN 202111467541.1, dated Apr. 25, 2025, 7 pages.

*Primary Examiner* — Sonya McCall-Shepard
(74) *Attorney, Agent, or Firm* — Dority & Manning, P.A.

(57) ABSTRACT

In a manufacturing method for an LDMOS integrated device, a provided semiconductor substrate has an NLDMOS area and a PLDMOS area; then a dielectric layer on the NLDMOS area and a dielectric layer on the PLDMOS area are formed on the semiconductor substrate, and a stress material layer is formed on the dielectric layer on the NLDMOS area and/or on the dielectric layer on the PLDMOS area, the thickness of the dielectric layer on the NLDMOS region being greater than the thickness of the dielectric layer on the PLDMOS region; then heat treatment is performed to adjust the stress of the stress material layer, so as to improve the electron mobility of a device; then the stress material layer is removed.

12 Claims, 2 Drawing Sheets

(51) Int. Cl.

| | |
|---|---|
| ***H10D 30/65*** | (2025.01) |
| ***H10D 64/00*** | (2025.01) |
| ***H10D 84/01*** | (2026.01) |
| ***H10D 84/03*** | (2025.01) |
| ***H10D 84/83*** | (2025.01) |
| ***H10D 84/85*** | (2025.01) |

(58) Field of Classification Search

CPC ............... H10D 84/85; H10D 84/0167; H10D 84/0165; H10D 30/601–608; H10D 64/111–20; H10D 30/603; H10D 30/791; H10D 30/792; H10D 30/0227; H10D 30/021; H10D 84/038

See application file for complete search history.

(56) References Cited

U.S. PATENT DOCUMENTS

| | | | | |
|---|---|---|---|---|
| 2011/0244638 | A1 | 10/2011 | Kikuchi et al. | |
| 2017/0222042 | A1 | 8/2017 | Lee | |
| 2021/0074699 | A1* | 3/2021 | Qiao .................... | H10D 30/657 |

FOREIGN PATENT DOCUMENTS

| | | | | |
|---|---|---|---|---|
| CN | 108574014 | A | 9/2018 | |
| CN | 110556388 | A | 12/2019 | |
| CN | 112825327 | A | 5/2021 | |
| CN | 113675087 | A * | 11/2021 | .............. H10P 30/40 |

* cited by examiner

MANUFACTURING METHOD FOR LDMOS INTEGRATED DEVICE

CROSS REFERENCE TO RELATED APPLICATIONS

This application is a national stage of PCT Patent Application No. PCT/CN2022/135755, entitled "MANUFACTURING METHOD FOR LDMOS INTEGRATED DEVICE", filed on Dec. 1, 2022; which claims priority to Chinese application No. 202111467541.1, entitled "MANUFACTURING METHOD FOR LDMOS INTEGRATED DEVICE", filed on Dec. 3, 2021, the contents of which are incorporated by reference herein in their entirety.

TECHNICAL FIELD

The present disclosure relates to a field of semiconductor technology, and more particularly, to a manufacturing method for a lateral double-diffused metal oxide semiconductor (LDMOS) integrated device.

BACKGROUND

In the development of a BCD process, there is co-development of devices such as Bipolar Junction Transistors (BJT), Complementary Metal Oxide Semiconductor (CMOS) devices, and Diffused Metal Oxide Semiconductor (DMOS) devices. DMOS devices may include LDMOS field effect devices and vertical double-diffused metal oxide semiconductor (VDMOS) field effect devices, which are widely used in integrated circuit designs because LDMOS devices are more compatible with CMOS processes than VDMOS devices.

The LDMOS integrated device includes N-channel LDMOS (NLDMOS) devices and P-channel LDMOS (PLDMOS) devices. In the design process of the LDMOS integrated device, the problem of how to improve performance of the LDMOS integrated device needs to be solved.

SUMMARY

The present disclosure provides a manufacturing method for an LDMOS integrated device, which can improve the performance of the LDMOS integrated device.

To achieve the above object, the present disclosure provides a manufacturing method for an LDMOS device. The manufacturing method includes:

- providing a semiconductor substrate having an NLDMOS area and an PLDMOS area, a P-type body area and an N-type drift area being formed in the NLDMOS area, an N-type source area being formed at top of the P-type body area, an N-type drain area being formed at top of the N-type drift area, and the NLDMOS area being formed with a first gate structure, an N-type body area and a P-type drift area being formed in the PLDMOS area, a P-type source area being formed at top of the N-type body area, a P-type drain area being formed at top of the P-type drift area, and a second gate structure being formed on the PLDMOS area;
- forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area;
- performing a heat treatment to adjust a stress of the stress material layer and increase electron mobility of the device; and
- removing the stress material layer.

Optionally, forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area includes: forming a tensile stress material layer only on the dielectric layer on the NLDMOS area.

Optionally, forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area includes:

- forming a dielectric material layer that covers the semiconductor substrate, the first gate structure and the second gate structure;
- forming a tensile stress material layer that covers the dielectric material layer;
- forming a patterned first mask layer on the tensile stress material layer, the first mask layer exposing at least the tensile stress material layer on the PLDMOS area; and removing the tensile stress material layer on the PLDMOS area with the first mask layer as a mask, a remaining tensile stress material layer on the NLDMOS area covering at least the N-type drift area; and
- etching away a part of a thickness of the dielectric material layer based on the first mask layer exposing at least the dielectric material layer on the PLDMOS area, so that a thickness of the dielectric material layer on at least the N-type drift area on the NLDMOS area is greater than a thickness of a remaining dielectric material layer on the PLDMOS area, a remaining dielectric material layer on the NLDMOS area being the dielectric layer on the NLDMOS area, and the remaining dielectric material layer on the PLDMOS area being the dielectric layer on the PLDMOS area.

Optionally, forming a patterned first mask layer on the tensile stress material layer, the first mask layer exposing at least the tensile stress material layer on the PLDMOS area; and removing the tensile stress material layer on the PLDMOS area with the first mask layer as a mask, a remaining tensile stress material layer on the NLDMOS area covering at least the N-type drift area includes:

- the remaining tensile stress material layer on the NLDMOS area also extends from the N-type source area through the first gate structure to the N-type drain area.

Optionally, the thickness of the dielectric layer on the PLDMOS area is 600 to 1200 angstroms.

Optionally, the thickness of the dielectric material layer is 1000 to 1800 angstroms.

Optionally, a thickness of the tensile stress material layer is 150 to 600 angstroms.

Optionally, the manufacturing method further includes: after removing the stress material layer,

- patterning the dielectric layer on the NLDMOS area and the dielectric layer on the PLDMOS area to expose the N-type source area, the N-type drain area, a part of the first gate structure, the P-type source area, the P-type drain area, and a part of the second gate structure; and forming a suspension-type conductive plug above the P-type drift area and/or the N-type drift area, a bottom of the suspension-type conductive plug resting above the P-type drift area and/or the N-type drift area and being spaced a predetermined distance from an upper surface of the P-type drift area and/or the N-type drift area.

Optionally, the manufacturing method further includes: after patterning the dielectric layer on the NLDMOS area and the dielectric layer on the PLDMOS area to expose the N-type source area, the N-type drain area, a part of the first gate structure, the P-type source area, the P-type drain area, and a part of the second gate structure, and before forming a suspension-type conductive plug above the P-type drift area and/or the N-type drift area, forming a silicide barrier layer on the patterned dielectric layer on the NLDMOS and on the dielectric layer on the PLDMOS area;

forming metal silicide layers on upper surfaces of the exposed N-type source area, the exposed N-type drain area, the exposed part of the first gate structure, the exposed P-type source area, the exposed P-type drain area, and the exposed part of the second gate structure;

forming an interlayer dielectric layer on the semiconductor substrate, and forming contact-type conductive plugs that penetrate the interlayer dielectric layer to the N-type source area, the N-type drain area, the first gate structure, the P-type source area, the P-type drain area, and the second gate structure; and forming the suspension-type conductive plug while forming the contact-type conductive plugs, the bottom of the suspension-type conductive plug resting on an upper surface of the silicide barrier layer, and a radial dimension of the suspension-type conductive plug being larger than a radial dimension of the contact-type conductive plug.

Optionally, forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area includes: forming a compressive stress material layer only on the dielectric layer on the PLDMOS area.

Optionally, forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area includes:

forming a dielectric material layer that covers the semiconductor substrate, the first gate structure and the second gate structure;

forming a compressive stress material layer that covers the dielectric material layer;

forming a patterned second mask layer on the compressive stress material layer, the second mask layer exposing at least the compressive stress material layer on the NLDMOS area; and removing the compressive stress material layer on the NLDMOS area with the second mask layer as a mask, a remaining compressive stress material layer on the PLDMOS area covering at least the P-type drift area; and removing the second mask layer, and forming an additional dielectric material layer on the dielectric material layer on the NLDMOS area so that a total thickness of the dielectric material layer on the NLDMOS area and the additional dielectric material layer is greater than a thickness of the dielectric material layer on the PLDMOS area, the dielectric material layer on the NLDMOS area and the additional dielectric material layer together forming the dielectric layer on the NLDMOS area, and the dielectric material layer on the PLDMOS area being the dielectric layer on the PLDMOS area.

In the manufacturing method for an LDMOS integrated device according to the present disclosure, a semiconductor substrate has a NLDMOS area and a PLDMOS area, a dielectric layer on the NLDMOS area and a dielectric layer on the PLDMOS area are formed on the semiconductor substrate; a stress material layer is formed on the dielectric layer on the NLDMOS area and/or on the dielectric layer on the PLDMOS area, and a heat treatment is performed to adjust the stress of the stress material layer, so that the electron mobility of the NLDMOS device and/or the PLDMOS device can be improved, thereby improving the performance of the LDMOS integrated device; further, the thickness of the dielectric layer on the NLDMOS area is greater than the thickness of the dielectric layer on the PLDMOS area, that is, the thickness of the dielectric layer under the Big contact of the NLDMOS area can meet its RESURF requirement, and the thickness of the dielectric layer on the Big contact of the PLDMOS area can meet its RESURF requirement, so that the overall RESURF capability of the Big contact of the LDMOS integrated device can be improved. In addition, for the thickness of the dielectric layer on the NLDMOS area or the thickness of the dielectric layer on the PLDMOS area, the injection conditions of the LDMOS integrated device can be readjusted, and the on-resistance of the LDMOS integrated device can be reduced, thereby contributing to further improving the performance of the PLDMOS device in the LDMOS integrated device, and finally, the high-performance NLDMOS and the high-performance PLDMOS can be simultaneously fabricated in the same process flow.

DESCRIPTION OF REFERENCE NUMERALS

Figure 1:
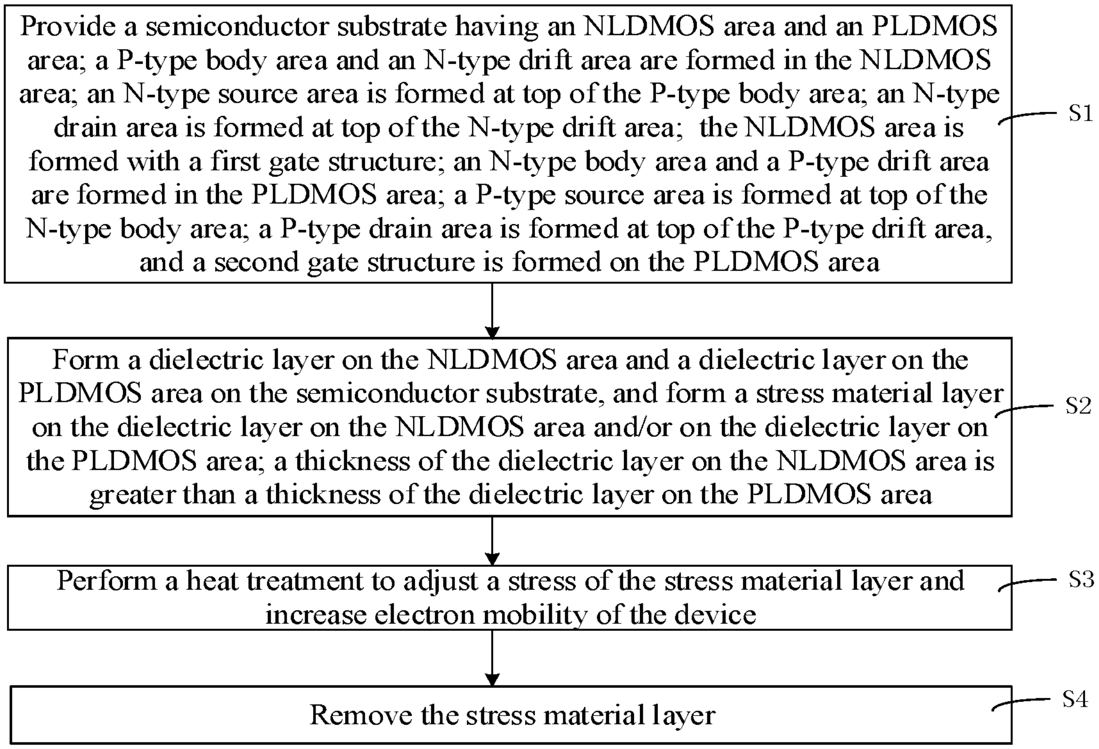
FIG. 1 is a schematic flow diagram of a manufacturing method for an LDMOS integrated device according to an embodiment of the present disclosure.

10: semiconductor substrate;
100*a*: NLDMOS area;
100*b*: PLDMOS area;
101: N-type drain area;
102: N-type source area;
103: a first gate structure;
104: P-type body area lead-out area;
105: P-type drain area;
106: P-type source area;

107: a second gate structure;
108: N-type body area lead-out area;
109: dielectric material layer;
**109*a***: dielectric layer on the NLDMOS area;
**109*b***: dielectric layer on the PLDMOS area;
110: tensile stress material layer;
111: silicide barrier layer;
112: interlayer dielectric layer;
**113*a***: suspension-type conductive plug;
**113*b***: contact-type conductive plug;
114: metal silicide layer.

DETAILED DESCRIPTION

A manufacturing method for an LDMOS integrated device according to the present disclosure will be described in further detail below with reference to the accompanying drawings and specific examples. Advantages and features of the present disclosure will become more apparent from the following description. It is to be noted that the drawings are in a very simplified form and use non-precise proportions only for the purpose of facilitating and clarifying the description of embodiments of the disclosure.

In the design and manufacturing process of an LDMOS integrated device, the inventors have found that the PLDMOS can be developed only by adjusting the process flow mainly based on the NLDMOS, and then by using the same process flow. In this way, the NLDMOS can only be developed to achieve an optimal characteristic, but the PLDMOS cannot be developed to achieve an optimal characteristic.

In addition, the inventors have also found that the reduced surface field (RESURF) technology is commonly used in the BCD process to reduce the surface electric field of the PLDMOS or NLDMOS drift area to improve the voltage resistance of the PLDMOS or NLDMOS. For a manner that the surface electric field is reduced by using Big contact (large contact hole for providing a conductive plug), the RESURF effect is determined by the thickness of the dielectric layer under Big contact. In order to ensure that the RESURF effect will not be affected, it is necessary to grow a SiN layer after SAB OX (silicide barrier oxide layer) as an etching barrier for suspending the Big contact, that is, the bottom of the Big contact needs to be suspended on the SiN, so that the dielectric layer under the Big contact is prevented from being over-etched, so as to enhance the RESURF effect and improve the voltage resistance of the PLDMOS or NLDMOS.

However, the SiN introduced as described above in turn has an additional effect on the device performance of the PLDMOS or NLDMOS. When the SiN is annealed, a large (+5%) positive current gain is generated for NLDMOS due to the change in the SiN stress, but a larger negative current gain (−10% or more or even failure) is generated for the corresponding PLDMOS current. That is, in the manufacturing process of the LDMOS integrated device, although the introduction of the SiN improves the RESURF capability of the Big contact of the NLDMOS, and the application of the stress to the wafer by the SAB OX layer also improves the NLDMOS performance, the performance of other devices (e.g., the PLDMOS) is degraded and disabled, and the requirement of simultaneously manufacturing the high-performance NLDMOS and the high-performance PLDMOS in the actual process production cannot be met.

In order to improve the performance of the LDMOS integrated device while improving the RESURF capability of the Big contact of the LDMOS integrated device, and realize simultaneous manufacture of the high-performance NLDMOS and the high-performance PLDMOS, the present embodiment provides a manufacturing method for the LDMOS integrated device.

FIG. 1 shows a flow diagram of a manufacturing method for an LDMOS integrated device according to the present embodiment. As shown in FIG. 1, the manufacturing method for an LDMOS integrated device includes the followings.

At S1, a semiconductor substrate is provided. The semiconductor substrate has a NLDMOS area and a PLDMOS area; a P-type body area and an N-type drift area is formed in the NLDMOS area; an N-type source area is form at the top of the P-type body area, and an N-type drain area is form at the top of the N-type drift area; a first gate structure is formed on the NLDMOS area. An N-type body area and a P-type drift area are formed in the PLDMOS area, a P-type source area is formed at the top of the N-type body area, a P-type drain area is formed at the top of the P-type drift area, and a second gate structure is formed on the PLDMOS area;

At S2, a dielectric layer on the NLDMOS area and a dielectric layer on the PLDMOS area are formed on the semiconductor substrate, and a stress material layer is formed on the dielectric layer on the NLDMOS area and/or on the dielectric layer on the PLDMOS area; a thickness of the dielectric layer on the NLDMOS area is greater than a thickness of the dielectric layer on the PLDMOS area;

At S3, heat treatment is performed to adjust a stress of the stress material layer and increase electron mobility of the device;

At S4, the stress material layer is removed.

FIGS. 2 to 5 are schematic cross-sectional views of structures in a process for manufacturing an LDMOS integrated device using the manufacturing method for the LDMOS integrated device according to an embodiment of the present disclosure. The manufacturing method for the LDMOS integrated device according to the present embodiment will be described below with reference to FIGS. 1 to 5.

Figure 2:
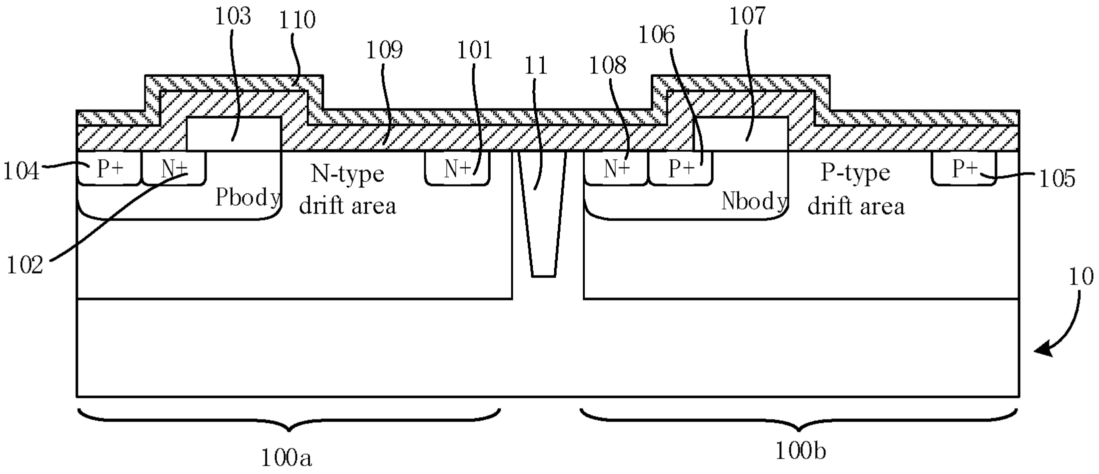
FIGS. 2 to 5 are schematic cross-sectional views of structures in a process for manufacturing an LDMOS integrated device using a manufacturing method for an LDMOS integrated device according to an embodiment of the present disclosure.

As illustrated in FIG. 2, the semiconductor substrate 10 may be a silicon substrate, but is not limited thereto. However, the semiconductor substrate 10 may be a germanium substrate, a silicon germanium substrate, silicon-on-insulator, or the like. In this embodiment, the semiconductor substrate 10 is P-type. In other embodiments, the semiconductor substrate 10 may be N-type.

The semiconductor substrate 10 has an NLDMOS area **100*a* and a PLDMOS area 100*b*. The NLDMOS area 100*a* may be used to form a NLDMOS device. The PLDMOS area 100*b*** may be used to form a PLDMOS device.

A P-type body area (Pbody) and an N-type drift area (N-Drift-Area) are formed in the NLDMOS area **100*a*, an N-type source area 102 is formed at the top of the P-type body area, an N-type drain area 101 is formed at the top of the N-type drift area, and a first gate structure 103 is formed on the NLDMOS area 100*a*. The first gate structure 103 is formed at least on an upper surface of the semiconductor substrate between the N-type source area 102 and the N-type drift area. The N-type source area 102 may extend laterally below the first gate structure 103**. In this embodiment, the N-type drift area surrounds the P-type body area. In other embodiments, the P-type body area and the N-type drift area are adjacent. In other embodiments, the P-type body area is spaced apart from the N-type drift area.

An N-type body area (Nbody) and a P-type drift area (P-Drift-Area) are formed in the PLDMOS area **100*b*, a P-type source area 106 is formed at the top of the N-type body area, a P-type drain area 105 is formed at the top of the P-type drift area, and a second gate structure 107 is formed on the PLDMOS area 100***b*. The second gate structure 107 is formed at least on the upper surface of the semiconductor substrate between the P-type source area 106 and the P-type drift area. The P-type source area 106 may extend laterally below the second gate structure 107. In this embodiment, the P-type drift area surrounds the N-type body area. In other embodiments, the P-type body area and the N-type drift area are adjacent. In other embodiments, the N-type body area is spaced apart from the P-type drift area.

As shown in FIG. 2, a P-type body area lead-out area 104 may further be formed at the top of the P-type body area. The P-type body area lead-out area 104 is located at a side of the N-type source area 102 remote from the first gate structure 103, and the doping concentration of the P-type body area lead-out area 104 is greater than the doping concentration of the P-type body area. An N-type body area lead-out area 108 may further be formed at the top of the N-type body area, the N-type body area lead-out area 108 is located on a side of the P-type drain area 105 remote from the second gate structure 107, and the doping concentration of the N-type body area lead-out area 108 is greater than the doping concentration of the N-type body area.

Referring to FIG. 2, the NLDMOS area 100*a* and the PLDMOS area 100*b* may be isolated by an isolation structure 11. The isolation structure 11 may be shallow trench isolation (STI), junction isolation or local silicon oxide isolation (LOCOS).

In an embodiment, for step S2, the tensile stress material layer may be formed only on the dielectric layer on the NLDMOS area. A situation where the tensile stress material layer is formed only on the dielectric layer on the NLDMOS area in step S2 is used as an example for description.

Figure 3:
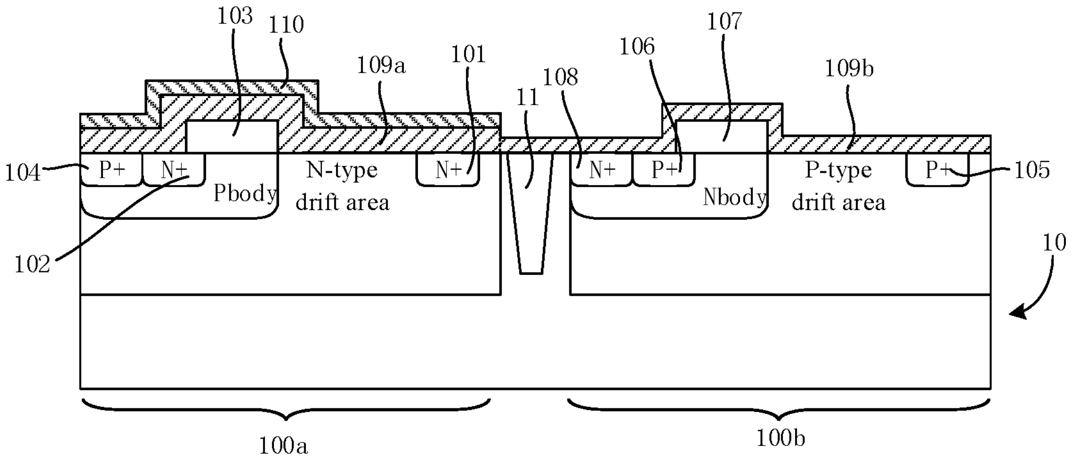

Referring to FIGS. 2 to 3, step S2 may include sub-steps S21 to S24.

At sub-step S21, as shown in FIG. 2, a dielectric material layer 109 that covers the semiconductor substrate 10 and the first gate structure 103 and the second gate structure 107 is formed.

The material of the dielectric material layer 109 may include silicon oxide. The thickness of the dielectric material layer 109 may be 1000 to 1800 angstroms, but not limited thereto. The thickness of the dielectric material layer 109 may be adjusted according to the actual situation of the NLDMOS device.

At sub-step S22, as shown in FIG. 2, a tensile stress material layer 110 that covers the dielectric material layer 109 is formed.

The material of the tensile stress material layer 110 may include at least one of silicon nitride and silicon oxynitride. The thickness of the tensile stress material layer 110 may be 150-600 angstroms, but not limited thereto. The thickness of the tensile stress material layer 110 may be adjusted according to the actual situation of the NLDMOS device.

At sub-step S23, as shown in FIG. 3, a patterned first mask layer (not shown) is formed on the tensile stress material layer 110. The first mask layer exposes at least the tensile stress material layer on the PLDMOS area 100*b*. The tensile stress material layer on the PLDMOS area 100*b* is removed with the first mask layer as a mask. The remaining tensile stress material layer on the NLDMOS area 100*a* covers at least the N-type drift area.

In an embodiment, at step S23, the remaining tensile stress material layer on the NLDMOS area 100*a* may extend from the N-type source area 102 through the first gate structure 103 to the N-type drain area 101, so that the remaining tensile stress material layer 110 may exert tensile stress on both the N-channel area (located below the first gate structure 103) and the N-type drift area of the NLDMOS device, thereby improving the electron mobility of the N-type drift area and the N-channel area of the NLDMOS device, contributing to reducing the on-resistance of the NLDMOS device without reducing the off-state breakdown voltage, improving the saturation current capability of the NLDMOS device, and improving the performance of the NLDMOS device.

At sub-step S24, as shown in FIG. 3, a part of a thickness of the dielectric material layer is etched away based on the first mask layer exposing at least the dielectric material layer on the PLDMOS area 100*b*, so that a thickness of the dielectric material layer on at least the N-type drift area on the NLDMOS area 100*a* is greater than the thickness of a remaining dielectric material layer on the PLDMOS area 100*b*, a remaining dielectric material layer on the NLDMOS area 100*a* is the dielectric layer 109*a* on the NLDMOS area, and the remaining dielectric material layer on the PLDMOS area 100*b* is the dielectric layer 109*b* on the PLDMOS area.

It should be noted that when the first mask layer covers only the N-type drift area and other areas of the NLDMOS area are exposed, and the dielectric material layer 109 is etched based on the first mask layer, the dielectric material layer of the NLDMOS area 100*a* not covered by the first mask layer is also etched to remove part of the thickness.

In step S23 and step S24, the tensile stress material layer on the NLDMOS area 100*a* can be retained and the tensile stress material layer on the PLDMOS area 100*b* can be removed using only one photolithography (using the first mask layer as a mask) and a corresponding one etching process, without negatively affecting the device performance of the PLDMOS while increasing the electron mobility of the NLDMOS. Meanwhile, a part of the thickness of the dielectric material layer on the PLDMOS area 100*b* is etched with the same first mask layer, so that the thickness of the dielectric layer 109*a* on the NLDMOS area is larger than the thickness of the dielectric layer 109*b* on the PLDMOS area, and thus the dielectric layer thickness under Big contact of the NLDMOS area and the dielectric layer thickness under Big contact of the PLDMOS area meet respective RESURF requirements. That is, the thickness of the dielectric layer below the Big contact of the NLDMOS area can satisfy its RESURF requirement, and the thickness of the dielectric layer below the Big contact of the PLDMOS area can satisfy its RESURF requirement.

In the conventional LDMOS integrated device manufacturing process, if the RESURF capability of the Big contact of the LDMOS integrated device is improved while the device performance of the NLDMOS and the PLDMOS is improved at the same time, separate manufacture of the NLDMOS and the PLDMOS is required, and two additional photolithography and etching processes are required, that is, one photolithography and one etching for the SiN of the NLDMOS, and one photolithography and one etching for the SiN of the PLDMOS. In step S23 and step S24 of the present embodiment, photolithography and etching only need to be added once, so that the RESURF capability of the Big contact of the LDMOS integrated device can be improved, and the device performance of the NLDMOS and the PLDMOS can be improved simultaneously.

Further, since the thickness of the dielectric layer 109*a* on the NLDMOS area is larger than the thickness of the dielectric layer 109*b* on the PLDMOS area, the implantation conditions of the PLDMOS device can be readjusted (for example, the doping concentration of the P-type drift area in the PLDMOS device can be appropriately increased), so that the on-resistance of the PLDMOS device can be reduced, and the performance of the PLDMOS device can be improved, thereby contributing to the simultaneous improvement of the performance of the NLDMOS device and the PLDMOS device.

In an embodiment, a part of the thickness of the dielectric material layer 109 on the PLDMOS area 100*b* may be etched away by an over-etching process such that the thickness of the dielectric layer 109*b* on the PLDMOS area is less than the thickness of the dielectric layer 109*a* on the NLDMOS area. The over-etching process may be accomplished by running the OVER ETCH program in the etching machine. As an example, the thickness to which the dielectric material layer 109 on the PLDMOS area 100*b* is removed can be controlled by adjusting the time of over-etching. In other embodiments, the part of the thickness of the removed dielectric material layer 109 may be etched using other etching methods known in the art.

In an embodiment, the thickness of the dielectric layer 109*b* on the PLDMOS area is 600 to 1200 angstroms. However, the remaining thickness of the dielectric layer 109*b* on the PLDMOS area may be adjusted according to actual conditions of the PLDMOS device.

After step S24, the first mask layer on the tensile stress material layer 110 may be removed. In this embodiment, the first mask layer may be removed by a mask removing process known in the art.

Next, step S3 is performed, which includes performing heat treatment to adjust the stress of the remaining tensile stress material layer 110 and improve the electron mobility of the NLDMOS device.

In this embodiment, the heat treatment process may be a Rapid Thermal Annealing (RTA) process or a Laser anneal process. However, other heat treatment processes known in the art may be used to perform heat treatment to the tensile stress material layer 110 (or the semiconductor substrate 10).

Figure 4:
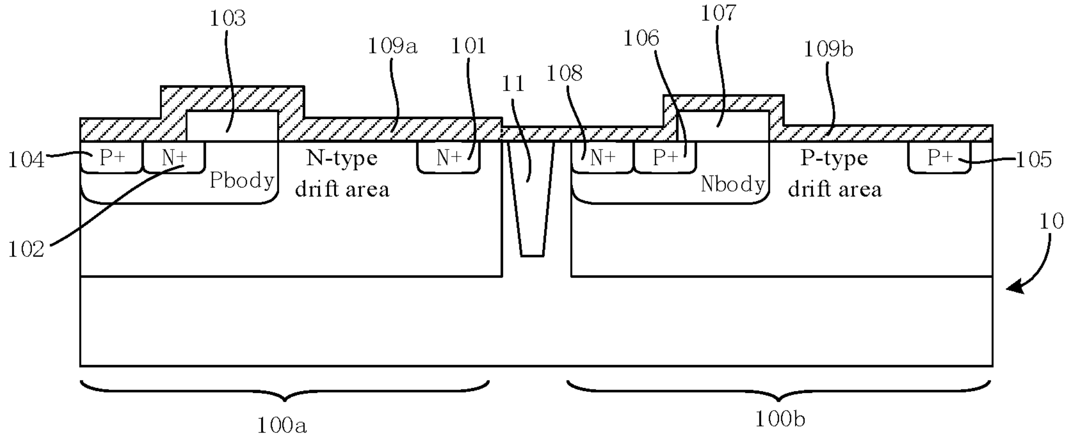

As shown in FIG. 4, step S4 may include removing the tensile stress material layer 110. The tensile stress material layer 110 may be removed in this embodiment using a wet etching process or a dry etching process.

In another embodiment, at step S2, a compressive stress material layer may be formed only on the dielectric layer on the PLDMOS area. Step S2 may specifically include forming a dielectric material layer that covers the semiconductor substrate 10, the first gate structure 103 and the second gate structure 107; forming a compressive stress material layer that covers the dielectric material layer; forming a patterned second mask layer on the compressive stress material layer, the second mask layer exposing at least the compressive stress material layer on the NLDMOS area 100*a*, removing the compressive stress material layer on the NLDMOS area 100*a* with the second mask layer as a mask, a remaining compressive stress material layer on the PLDMOS area 100*b* covering at least the P-type drift area; removing the second mask layer, and forming an additional dielectric material layer on the dielectric material layer on the NLDMOS area 100*a* so that a total thickness of the dielectric material layer on the NLDMOS area 100*a* and the additional dielectric material layer is greater than a thickness of the dielectric material layer on the PLDMOS area 100*b*; the dielectric material layer on the NLDMOS area 100*a* and the additional dielectric material layer together form the dielectric layer on the NLDMOS area, and the dielectric material layer on the PLDMOS area is the dielectric layer on the PLDMOS area.

In this manner, the compressive stress material layer on the subsequent PLDMOS area 100*b* can at least apply a compressive stress to the P-type drift area, thereby helping to improve the electron mobility of the PLDMOS device without negatively affecting the device performance of the NLDMOS and improving the performance of the LDMOS integrated device. Meanwhile, it is possible to realize that the thickness of the dielectric layer on the NLDMOS area is greater than the thickness of the dielectric layer on the PLDMOS area, so that the thickness of the dielectric layer on the Big contact of the NLDMOS area and the thickness of the dielectric layer on the Big contact of the PLDMOS area meet respective RESURF requirements, thereby enabling the overall improvement of the RESURF capability of the Big contact of the LDMOS integrated device. In addition, the injection conditions of the PLDMOS device can be adjusted to reduce the on-resistance of the PLDMOS device, thereby helping to further improve the performance of the PLDMOS device in the LDMOS integrated device. In this embodiment, step S3 may include performing a heat treatment to adjust the stress of the compressive stress material layer. Step S4 may include removing the compressive stress material layer.

After step S4, the manufacturing method for the LDMOS integrated device may further include steps S5 to S6.

In step S5, the dielectric layer 109*a* on the NLDMOS area and the dielectric layer 109*b* on the PLDMOS area are patterned to expose the N-type source area 102, the N-type drain area 101, a part of the first gate structure 103, the P-type source area 106, the P-type drain area 105, and a part of the second gate structure 107.

Figure 5:
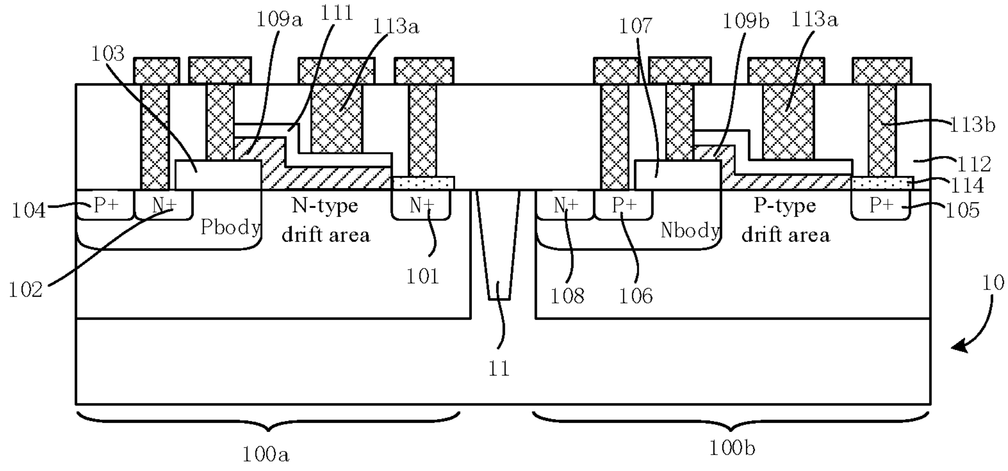

In step S6, as shown in FIG. 5, a suspension-type conductive plug 113*a* is formed above the P-type drift area and/or the N-type drift area, and the bottom of the suspension-type conductive plug 113 rests above the P-type drift area and/or the N-type drift area and is spaced a predetermined distance from an upper surface of the P-type drift area and/or the N-type drift area.

After step S5 and before step S6, the manufacturing method for the LDMOS integrated device may further include forming a silicide barrier layer 111 on the patterned dielectric layer 109*a* on the NLDMOS and on the dielectric layer 109*b* on the PLDMOS area, i.e., forming a silicide barrier layer 111 on the remaining dielectric layer 109*a* on the NLDMOS area and on the remaining dielectric layer 109*b* on the PLDMOS area, as shown in FIG. 5; forming metal silicide layers 114 on upper surfaces of the exposed N-type source area 102, the exposed N-type drain area 101, the exposed part of the first gate structure 103, the exposed P-type source area 106, the exposed P-type drain area 105, and the exposed part of the second gate structure 107 (only a part of the metal silicide layers 114 are shown in FIG. 5); forming an interlayer dielectric layer 112 on the semiconductor substrate 10, and forming contact-type conductive plugs 113*b* that penetrate the interlayer dielectric layer 112 to the N-type source area 102, the N-type drain area 101, the first gate structure 103, the P-type source area 106, the P-type drain area 105, and the second gate structure 107.

The suspension-type conductive plug 113*a* is formed while the contact-type conductive plugs 113*b* are formed, the bottom of the suspension-type conductive plug 113*a* rests on an upper surface of the silicide barrier layer 111, and a radial dimension of the suspension-type conductive plug 113*a* is larger than the radial dimension of the contact-type conductive plug 113*b*.

The thickness of the silicide barrier layer 111 may be 200-300 angstroms, but not limited thereto, the thickness of the silicide barrier layer 111 may be adjusted as desired. The material of the interlayer dielectric layer 112 may include silicon oxide.

It should be noted that the suspension-type conductive plug 113*a* may be referred to as a Field Plating (FP) and can be used to reduce the surface electric field of the N-type drift area and/or the P-type drift area. The radial dimension of the suspension-type conductive plug 113*a* is larger than the radial dimension of the contact-type conductive plug 113*b*, and the thickness of the dielectric layer 109*b* on the PLDMOS area is smaller than the thickness of the dielectric layer 109*a* on the NLDMOS area, so that the surface electric field of the N-type drift area and the P-type drift area can be effectively reduced, and the performance of the NLDMOS device and the PLDMOS device can be improved. Furthermore, by adjusting the implantation conditions of the P-type drift area of the PLDMOS device in coordination, the performance of the PLDMOS device can be further improved.

Each of the contact-type conductive plug 113*b* and the suspension-type conductive plug 113*a* may be a metal material such as tungsten or aluminum or a metal alloy.

In the manufacturing method for an LDMOS integrated device according to the present disclosure, a semiconductor substrate 10 has a NLDMOS area 100*a* and a PLDMOS area 100*b*; a dielectric layer 109*a* on the NLDMOS area and a dielectric layer 109*b* on the PLDMOS area are formed on the semiconductor substrate 10; a stress material layer is formed on the dielectric layer 109*a* on the NLDMOS area and/or on the dielectric layer 109*b* on the PLDMOS area, and a heat treatment is performed to adjust the stress of the stress material layer, so that the electron mobility of the NLDMOS device and/or the PLDMOS device can be improved, thereby improving the performance of the LDMOS integrated device; further, the thickness of the dielectric layer 109*a* on the NLDMOS area is larger than the thickness of the dielectric layer 109*b* on the PLDMOS area, that is, the thickness of the dielectric layer under the Big contact of the NLDMOS area can meet its RESURF requirement, and the thickness of the dielectric layer under the Big contact of the PLDMOS area can meet its RESURF requirement, so that the overall RESURF capability of the Big contact of the LDMOS integrated device can be improved. In addition, for the thickness of the dielectric layer 109*a* on the NLDMOS area or the thickness of the dielectric layer 109*b* on the PLDMOS area, the injection conditions of the PLDMOS device can be readjusted, and the on-resistance of the LDMOS integrated device can be reduced, thereby contributing to further improving the performance of the PLDMOS device in the LDMOS integrated device, and finally, the high-performance NLDMOS and the high-performance PLDMOS can be simultaneously manufactured in a same process flow.

The foregoing description is merely illustrative of the preferred embodiments of the present disclosure, and is not intended to limit the scope of the present disclosure. Any person skilled in the art, without departing from the spirit and scope of the present disclosure, may make possible variations and modifications of the technical solutions of the present disclosure using the methods and technical contents disclosed above. Therefore, any simple modifications, equivalent variations and modifications of the above embodiments in accordance with the essence of the present disclosure, without departing from the content of the technical solutions of the present disclosure, are within the scope of the technical solutions of the present disclosure.

What is claimed is:

1. A manufacturing method for a lateral double-diffused metal oxide semiconductor (LDMOS) integrated device, comprising:

providing a semiconductor substrate having an N-channel LDMOS (NLDMOS) area and a P-channel LDMOS (PLDMOS) area, a P-type body area and an N-type drift area being formed in the NLDMOS area, an N-type source area being formed at top of the P-type body area, an N-type drain area being formed at top of the N-type drift area, and the NLDMOS area being formed with a first gate structure, an N-type body area and a P-type drift area being formed in the PLDMOS area, a P-type source area being formed at top of the N-type body area, a P-type drain area being formed at top of the P-type drift area, and a second gate structure being formed on the PLDMOS area;

forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area;

performing a heat treatment to adjust a stress of the stress material layer and increase electron mobility of the device;

removing the stress material layer; and forming a suspension-type conductive plug above the P-type drift area and/or the N-type drift area, a bottom of the suspension-type conductive plug resting above the P-type drift area and/or the N-type drift area and being spaced a predetermined distance from an upper surface of the P-type drift area and/or the N-type drift area.

2. The manufacturing method of claim 1, wherein forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area comprises: forming a tensile stress material layer only on the dielectric layer on the NLDMOS area.

3. The manufacturing method of claim 2, wherein forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area comprises:

forming a dielectric material layer that covers the semiconductor substrate, the first gate structure and the second gate structure;

forming a tensile stress material layer that covers the dielectric material layer;

forming a patterned first mask layer on the tensile stress material layer, the first mask layer exposing at least the tensile stress material layer on the PLDMOS area; and removing the tensile stress material layer on the PLDMOS area with the first mask layer as a mask, a remaining portion of the tensile stress material layer on the NLDMOS area covering at least the N-type drift area; and etching away a part of a thickness of the dielectric material layer based on the first mask layer exposing at least the dielectric material layer on the PLDMOS area, so that a thickness of the dielectric material layer on at least the N-type drift area on the NLDMOS area is greater than a thickness of a remaining portion of the dielectric material layer on the PLDMOS area, a remaining portion of the dielectric material layer on the NLDMOS area being the dielectric layer on the NLDMOS area, and the remaining portion of the dielectric material layer on the PLDMOS area being the dielectric layer on the PLDMOS area.

4. The manufacturing method of claim 3, wherein the remaining portion of the tensile stress material layer on the NLDMOS area also extends from the N-type source area through the first gate structure to the N-type drain area.

5. The manufacturing method of claim 2, wherein the thickness of the dielectric layer on the PLDMOS area is 600 to 1200 angstroms.

6. The manufacturing method of claim 3, wherein the thickness of the dielectric material layer is 1000 to 1800 angstroms.

7. The manufacturing method of claim 2, wherein a thickness of the tensile stress material layer is 150 to 600 angstroms.

8. The manufacturing method of claim 1, further comprising: after removing the stress material layer, patterning the dielectric layer on the NLDMOS area and the dielectric layer on the PLDMOS area to expose the N-type source area, the N-type drain area, a part of the first gate structure, the P-type source area, the P-type drain area, and a part of the second gate structure.

9. The manufacturing method of claim 8, further comprising: after patterning the dielectric layer on the NLDMOS area and the dielectric layer on the PLDMOS area to expose the N-type source area, the N-type drain area, a part of the first gate structure, the P-type source area, the P-type drain area, and a part of the second gate structure, and before forming the suspension-type conductive plug above the P-type drift area and/or the N-type drift area, forming a silicide barrier layer on the patterned dielectric layer on the NLDMOS and on the dielectric layer on the PLDMOS area;

forming metal silicide layers on upper surfaces of the exposed N-type source area, the exposed N-type drain area, the exposed part of the first gate structure, the exposed P-type source area, the exposed P-type drain area, and the exposed part of the second gate structure;

forming an interlayer dielectric layer on the semiconductor substrate, and forming contact-type conductive plugs that penetrate the interlayer dielectric layer to the N-type source area, the N-type drain area, the first gate structure, the P-type source area, the P-type drain area, and the second gate structure; and forming the suspension-type conductive plug while forming the contact-type conductive plugs, the bottom of the suspension-type conductive plug resting on an upper surface of the silicide barrier layer, and a radial dimension of the suspension-type conductive plug being larger than a radial dimension of the contact-type conductive plug.

10. The manufacturing method of claim 1, wherein forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area comprises: forming a compressive stress material layer only on the dielectric layer on the PLDMOS area.

11. The manufacturing method of claim 10, wherein forming a dielectric layer on the NLDMOS area and a dielectric layer on the PLDMOS area on the semiconductor substrate, and forming a stress material layer on the dielectric layer on the NLDMOS area and/or on the dielectric layer on the PLDMOS area, a thickness of the dielectric layer on the NLDMOS area being greater than a thickness of the dielectric layer on the PLDMOS area comprises:

forming a dielectric material layer that covers the semiconductor substrate, the first gate structure and the second gate structure;

forming a compressive stress material layer that covers the dielectric material layer;

forming a patterned second mask layer on the compressive stress material layer, the second mask layer exposing at least the compressive stress material layer on the NLDMOS area; and removing the compressive stress material layer on the NLDMOS area with the second mask layer as a mask, a remaining portion of the compressive stress material layer on the PLDMOS area covering at least the P-type drift area; and removing the second mask layer, and forming an additional dielectric material layer on the dielectric material layer on the NLDMOS area so that a total thickness of the dielectric material layer on the NLDMOS area and the additional dielectric material layer is greater than a thickness of the dielectric material layer on the PLDMOS area, the dielectric material layer on the NLDMOS area and the additional dielectric material layer together forming the dielectric layer on the NLDMOS area, and the dielectric material layer on the PLDMOS area being the dielectric layer on the PLDMOS area.

12. The manufacturing method of claim 9, wherein a thickness of the silicide barrier layer is 200 to 300 angstroms.

* * * * *